(12) United States Patent
Pan et al.

(10) Patent No.: US 10,879,257 B2
(45) Date of Patent: Dec. 29, 2020

(54) INTEGRATED CHIP HAVING A LOGIC GATE ELECTRODE AND A TUNNEL DIELECTRIC LAYER

(71) Applicant: Taiwan Semiconductor Manufacturing Co., Ltd., Hsin-Chu (TW)

(72) Inventors: Jui-Yu Pan, Neipu Township (TW); Cheng-Bo Shu, Tainan (TW); Chung-Jen Huang, Tainan (TW); Jing-Ru Lin, Kaohsiung (TW); Tsung-Yu Yang, Tainan (TW); Yun-Chi Wu, Tainan (TW); Yueh-Chieh Chu, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/144,286

(22) Filed: Sep. 27, 2018

(65) Prior Publication Data
US 2019/0043878 A1     Feb. 7, 2019

Related U.S. Application Data

(62) Division of application No. 15/365,156, filed on Nov. 30, 2016, now Pat. No. 10,269,822.
(Continued)

(51) Int. Cl.
*H01L 27/11568*     (2017.01)
*H01L 27/11582*     (2017.01)
(Continued)

(52) U.S. Cl.
CPC ... *H01L 27/11568* (2013.01); *H01L 21/31111* (2013.01); *H01L 27/11582* (2013.01);
(Continued)

(58) Field of Classification Search
CPC ............ H01L 29/792; H01L 29/66825; H01L 29/66833; H01L 29/3234; H01L 21/28282;
(Continued)

(56) References Cited

U.S. PATENT DOCUMENTS 5,404,037 A * 4/1995 Manley ................. H01L 27/115
257/318
5,514,607 A * 5/1996 Taneda .............. H01L 29/42328
438/259

(Continued)

FOREIGN PATENT DOCUMENTS

| JP | 2006245046 A | 9/2006 |
| JP | 2007080338 A | 3/2007 |
| JP | 2007294082 A | 11/2007 |

OTHER PUBLICATIONS

Non-Final Office Action dated Jun. 15, 2017 for U.S. Appl. No. 15/365,156.
(Continued)

*Primary Examiner* — Khiem D Nguyen
(74) *Attorney, Agent, or Firm* — Eschweiler & Potashnik, LLC

(57) ABSTRACT

The present disclosure relates to a method of forming an embedded flash memory cell that provides for improved performance by providing for a tunnel dielectric layer having a relatively uniform thickness, and an associated apparatus. The method is performed by forming a charge trapping dielectric structure over a logic region, a control gate region, and a select gate region within a substrate. A first charge trapping dielectric etching process is performed to form an opening in the charge trapping dielectric structure over the logic region, and a thermal gate dielectric layer is formed within the opening. A second charge trapping dielectric etching process is performed to remove the charge trapping
(Continued)

dielectric structure over the select gate region. Gate electrodes are formed over the thermal gate dielectric layer and the charge trapping dielectric structure remaining after the second charge trapping dielectric etching process.

20 Claims, 14 Drawing Sheets

Related U.S. Application Data

(60) Provisional application No. 62/272,195, filed on Dec. 29, 2015, provisional application No. 62/288,796, filed on Jan. 29, 2016.

(51) Int. Cl.
  *H01L 49/02* (2006.01)
  *H01L 21/311* (2006.01)
  *H01L 29/66* (2006.01)
  *H01L 29/792* (2006.01)

(52) U.S. Cl.
  CPC ........ *H01L 28/00* (2013.01); *H01L 29/66833* (2013.01); *H01L 29/792* (2013.01)

(58) Field of Classification Search
  CPC ............. H01L 21/76224; H01L 29/518; H01L 29/42324; H01L 29/4234; H01L 21/8221; H01L 27/11573; H01L 27/11568; H01L 27/1157; H01L 27/115; H01L 27/11524; H01L 27/11521; H01L 27/11578; H01L 27/11529; H01L 29/42328; H01L 29/42332; H01L 29/42348; H01L 29/42364; H01L 29/42368; H01L 29/40117; H01L 29/788
  See application file for complete search history.

(56) References Cited

U.S. PATENT DOCUMENTS

| | | | | |
|---|---|---|---|---|
| 6,133,093 | A * | 10/2000 | Prinz | H01L 27/11526 257/E21.689 |
| 6,174,759 | B1 | 1/2001 | Verhaar et al. | |
| 6,329,257 | B1 * | 12/2001 | Luning | H01L 29/0847 438/301 |
| 6,660,587 | B2 * | 12/2003 | Ahn | H01L 21/28061 438/257 |
| 6,667,511 | B1 | 12/2003 | Fang | |
| 6,767,791 | B1 | 7/2004 | Wu et al. | |
| 6,787,416 | B2 | 9/2004 | Kuo et al. | |
| 7,465,644 | B1 | 12/2008 | Chan et al. | |
| 7,495,279 | B2 | 2/2009 | Shum et al. | |
| 7,816,726 | B2 * | 10/2010 | He | H01L 27/115 257/324 |
| 8,173,505 | B2 * | 5/2012 | Herrick | B82Y 10/00 257/E21.422 |
| 8,455,923 | B2 * | 6/2013 | Lee | H01L 27/11526 257/202 |
| 9,054,220 | B2 * | 6/2015 | Cheek | H01L 27/11546 |
| 2005/0277250 | A1 | 12/2005 | Pan et al. | |
| 2006/0023558 | A1 * | 2/2006 | Cho | G11C 16/0483 365/230.06 |
| 2006/0086970 | A1 * | 4/2006 | Kim | H01L 29/4234 257/321 |
| 2006/0105522 | A1 | 5/2006 | Steimle et al. | |
| 2006/0131641 | A1 * | 6/2006 | Ozawa | H01L 27/115 257/321 |
| 2006/0160311 | A1 | 7/2006 | Rao et al. | |
| 2006/0252227 | A1 * | 11/2006 | Lee | H01L 27/11 438/400 |
| 2006/0261398 | A1 | 11/2006 | Lee | |
| 2007/0066087 | A1 | 3/2007 | Jung | |
| 2007/0230254 | A1 | 10/2007 | Osame et al. | |
| 2007/0281423 | A1 | 12/2007 | Shih et al. | |
| 2008/0061358 | A1 | 3/2008 | Choi | |
| 2008/0064158 | A1 * | 3/2008 | Shih | H01L 27/105 438/201 |
| 2008/0105945 | A1 | 5/2008 | Steimle et al. | |
| 2009/0039411 | A1 | 2/2009 | Anezaki | |
| 2012/0208342 | A1 * | 8/2012 | Ogura | H01L 21/76224 438/400 |
| 2013/0023101 | A1 | 1/2013 | Chan et al. | |
| 2013/0264633 | A1 * | 10/2013 | Hall | H01L 27/04 257/326 |
| 2013/0267067 | A1 | 10/2013 | Lee et al. | |
| 2014/0374814 | A1 | 12/2014 | Wu et al. | |
| 2014/0374815 | A1 | 12/2014 | Wu et al. | |
| 2015/0069524 | A1 | 3/2015 | Hong et al. | |
| 2015/0137206 | A1 * | 5/2015 | Liu | H01L 29/66825 257/316 |
| 2015/0206891 | A1 * | 7/2015 | Chuang | H01L 27/11573 257/325 |
| 2016/0064396 | A1 * | 3/2016 | Liu | H01L 21/28273 257/321 |

OTHER PUBLICATIONS

Final Office Action dated Dec. 28, 2017 for U.S. Appl. No. 15/365,156.

Non-Final Office Action dated May 17, 2018 for U.S. Appl. No. 15/365,156.

* cited by examiner

2200

2300

INTEGRATED CHIP HAVING A LOGIC GATE ELECTRODE AND A TUNNEL DIELECTRIC LAYER

REFERENCE TO RELATED APPLICATIONS

This Application is a Divisional of U.S. application Ser. No. 15/365,156 filed on Nov. 30, 2016, issued as U.S. Pat. No. 10,269,822, which claims priority to U.S. Provisional Application No. 62/272,195 filed on Dec. 29, 2015 and U.S. Provisional Application No. 62/288,796 filed on Jan. 29, 2016. The contents of the above-referenced applications are hereby incorporated by reference in their entirety.

BACKGROUND

Embedded memory is electronic memory that is integrated with logic devices on a common integrated circuit (IC) die or chip. Embedded memory is able to support operation of the logic devices and is often used with very-large-scale integration (VLSI) IC dies or chips. The integration advantageously improves performance by eliminating interconnect structures between chips and advantageously reduces manufacturing costs by sharing process steps between the embedded memory and the logic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
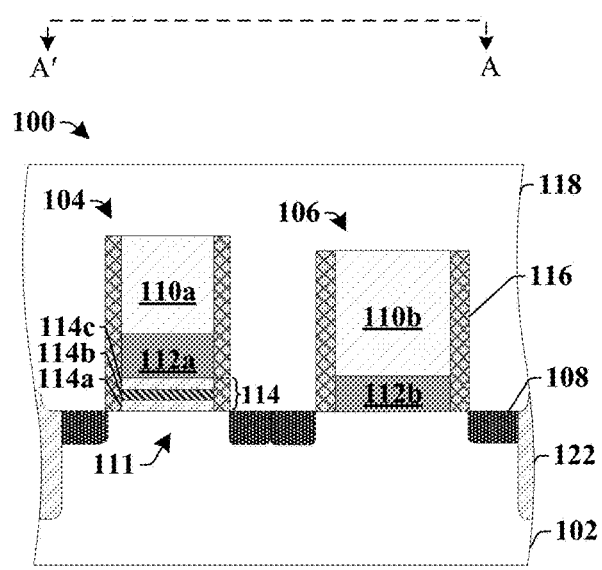
FIGS. 1A-1C illustrate some embodiments of an integrated chip comprising an embedded flash memory cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embedded flash memory cells often comprise a charge trapping dielectric structure arranged between a control gate and a substrate. The charge trapping dielectric structure may include a tri-layer structure having a tunnel dielectric layer, a charge trapping layer, and a blocking dielectric layer. During fabrication of an embedded flash memory cell, the charge trapping dielectric structure is deposited onto the substrate. The control gate is then formed and the charge trapping dielectric structure is subsequently etched to confine the charge trapping dielectric structure below the control gate. During etching of the charge trapping additional structure, sides of the tunnel dielectric layer may be exposed. Consequently, during subsequent thermal oxidation steps, oxygen can diffuse into end regions of the tunnel dielectric layer and cause the end regions of the tunnel dielectric layer to grow thicker through lateral oxide encroachment. Such thickening of the end regions forms a tunnel dielectric layer having a non-uniform thickness, which can negatively impact performance (e.g., reduce a size of the voltage threshold window) of the embedded flash memory cell.

The present disclosure relates to a method of forming an embedded flash memory cell that provides for improved performance by providing for a tunnel dielectric layer having a relatively uniform thickness, and an associated apparatus. The method is performed by forming a charge trapping dielectric structure over a logic region, a control gate region, and a select gate region within a substrate. A first charge trapping dielectric etching process is performed to form an opening in the charge trapping dielectric structure over the logic region, and a thermal gate dielectric layer is formed within the opening. A second charge trapping dielectric etching process is performed to remove the charge trapping dielectric structure over the select gate region. Gate electrodes are formed over the thermal gate dielectric layer and the charge trapping dielectric structure remaining after the second charge trapping dielectric etching process. Keeping the charge trapping dielectric structure in place over the select gate region during the formation of the thermal gate dielectric layer prevents lateral oxide encroachment on the control gate region and improves performance of the embedded flash memory cell.

Figure 1B:
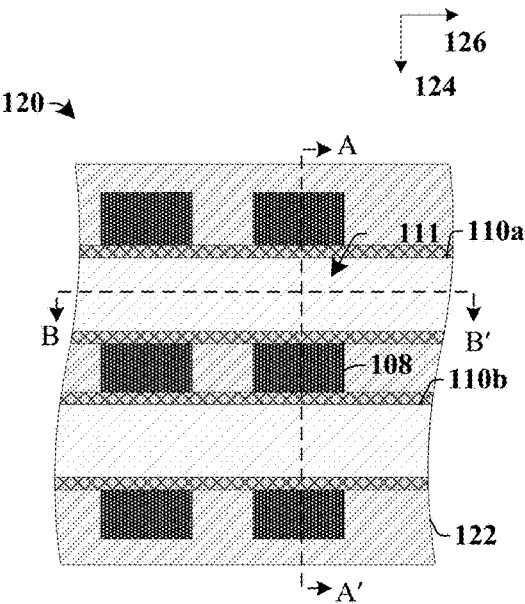
Figure 1C:
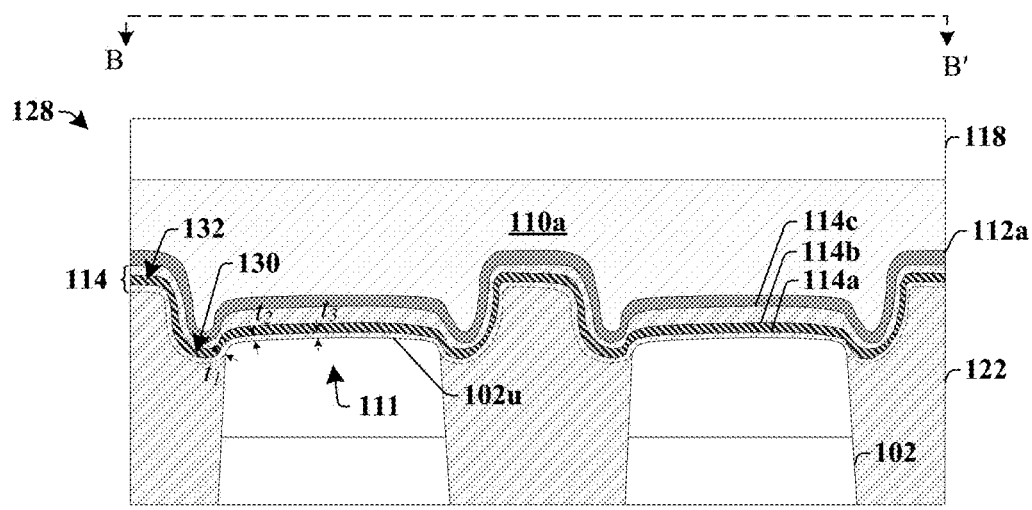

FIGS. 1A-1C illustrate some embodiments of an integrated chip having an embedded flash memory cell.

As shown in cross-sectional view 100 of FIG. 1A, the integrated chip comprises an embedded flash memory cell arranged on a substrate 102. The embedded flash memory cell includes a control gate 104 and a select gate 106. The control gate 104 comprises a control gate electrode 110a laterally arranged between source/drain regions 108 and vertically separated from the substrate 102 by way of a first gate dielectric layer 112a and a charge trapping dielectric structure 114. The select gate 106 comprises a select gate electrode 110b laterally arranged between source/drain regions 108 and vertically separated from the substrate 102 by a second gate dielectric layer 112b. In some embodiments, dielectric sidewall spacer structures 116 may be arranged on opposing sides of the control gate 104 and the select gate 106. An inter-level dielectric (ILD) layer 118 is arranged over the substrate 102.

The charge trapping dielectric structure 114 comprises a multi-layer dielectric structure configured to store (i.e., trap) different amounts of charge, which respectively correspond to a data state (e.g., representing a logical "0" or a logical "1"). The charge trapping dielectric structure 114 comprises a tunnel dielectric layer 114a arranged onto the substrate 102, a charge trapping dielectric layer 114b arranged onto the tunnel dielectric layer 114a, and a blocking dielectric layer 114c arranged onto the charge trapping dielectric layer 114b. To read the charge stored in the charge trapping dielectric structure 114, a bias voltage is applied to the control gate electrode 110a. The stored charge screens an electric field produced by the control gate electrode 110a, causing the threshold voltage of the control gate 104 to vary. Therefore, depending upon an amount of charge stored in the charge trapping dielectric structure 114, the bias voltage may cause a channel region 111 underlying the control gate electrode 110a to conduct, indicating a logical "0" or a logical "1". To add charges to the charge trapping dielectric structure 114, the control gate electrode 110a and the select gate electrode 110b may be biased to promote hot carrier injection. To remove charge in the charge trapping dielectric structure 114 the control gate electrode 110a may be biased with a high voltage to promote Fowler-Nordheim tunneling (FNT) of the charges out of the charge trapping dielectric structure 114.

FIG. 1B illustrates some embodiments of a top-view 120 of the integrated chip of FIG. 1A (FIG. 1A is shown along cross-sectional line A-A' of FIG. 1B). As shown in top-view 120, the control gate electrode 110a and the select gate electrode 110b are arranged along a first direction 124 between the source/drain regions 108. The source/drain regions 108 are separated from one another along a second direction 126 by isolation regions 122 (e.g., shallow trench isolation (STI) regions).

FIG. 1C illustrates some embodiments of a cross-sectional view 128 of the integrated chip along the second direction 126 (along cross-sectional line B-B' of FIG. 1B). As shown in cross-sectional view 128, the isolation regions 122 are arranged within the substrate 102 on opposing sides of the source/drain regions 108 within the substrate 102. In some embodiments, the substrate 102 has an upper surface 102u that is curved between the isolation regions 122, so that a center of the upper surface 102u is higher than edges of the upper surface 102u. In some embodiments, the isolation regions 122 may comprise a depressed region 130 that is recessed below the upper surface 102u and a raised region 132 that is elevated above the upper surface 102u and that is laterally separated from the substrate 102 by the depressed region 130.

The tunnel dielectric layer 114a has a relatively uniform thickness that increases by a small amount as a distance from an isolation region 122 decreases. For example, the tunnel dielectric layer 114a has a first thickness $t_1$, a second thickness $t_2$ less than the first thickness $t_1$, and a third thickness $t_3$ that is less than the second thickness $t_2$. The thicknesses of the tunnel dielectric layer 114a may decrease by less than approximately 25% between the first thickness $t_1$ and the third thickness $t_3$. For example, in some embodiments, the thicknesses of the tunnel dielectric layer 114a may decrease by a range of between approximately 5% and approximately 25%.

For example, in some embodiments, the thicknesses of the tunnel dielectric layer 114a may change by less than approximately 5 nm between the first thickness $t_1$ and the third thickness $t_3$ (e.g., the thicknesses of the tunnel dielectric layer 114a may decrease from a first thickness $t_1$ of approximately 20 nm to a third thickness $t_3$ of approximately 15 nm). In other embodiments, the thickness of the tunnel dielectric layer 114a may change by less than 3 nm between the first thickness $t_1$ and the third thickness $t_3$.

The relatively small increase in thickness of the tunnel dielectric layer 114a gives the embedded flash memory cell a relatively small variation in threshold voltage, thereby improving performance and/or reliability of the embedded flash memory cell.

Figure 2:
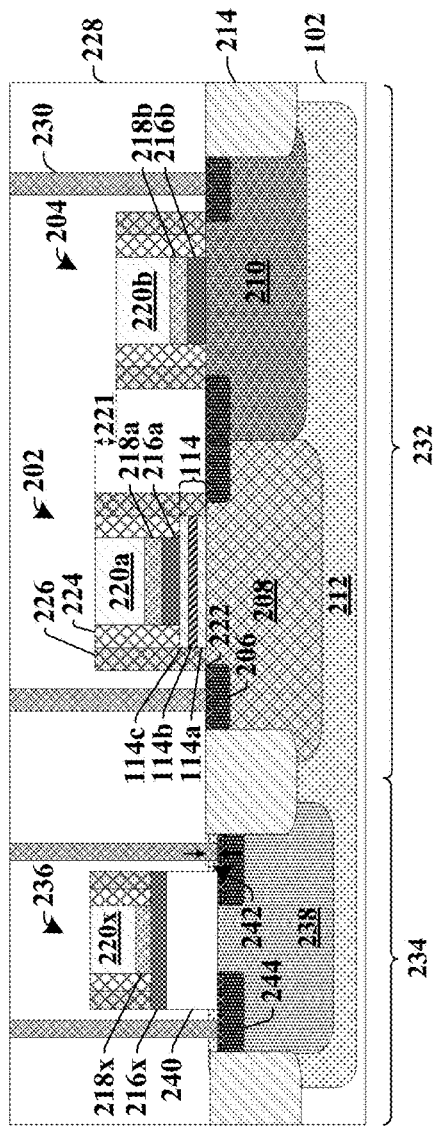
FIG. 2 illustrates a cross-sectional view of some additional embodiments of an integrated chip comprising an embedded flash memory cell.

FIG. 2 illustrates a cross-sectional view of some additional embodiments of an integrated chip 200 having an embedded flash memory cell.

The integrated chip 200 comprises a memory region 232 and a logic region 234. The memory region 232 comprises an embedded flash memory cell (e.g., an embedded SONOS flash memory cell) having a control gate 202 and a select gate 204 arranged over a substrate 102 at locations between source/drain regions 206. The source/drain regions 206 comprise highly doped regions having a first doping type (e.g., n-type) disposed within an upper surface of the substrate 102. In some embodiments, the control gate 202 is arranged over a control well 208 having a second doping type (e.g., p-type) and the select gate 204 is arranged over a select well 210 having the second doping type (e.g., p-type). In some additional embodiments, the control well 208 and the select well 210 may be arranged within a deep well 212 having the first doping type (e.g., n-type). In some embodiments, the control gate 202 and the select gate 204 may share a source/drain region 206 arranged laterally between the control gate 202 and the select gate 204.

The control gate 202 comprises a control gate electrode 220a separated from a substrate 102 by a charge trapping dielectric structure 114 and one or more additional gate dielectric layers 216a and/or 218a. The select gate 204 comprises a select gate electrode 220b separated from the substrate 102 by one or more additional gate dielectric layers 216b and/or 218b. In some embodiments, the upper surface of the control gate electrode 220a is higher than the upper surface of the select gate electrode 220b. For example, the upper surface of the control gate electrode 220a may be vertically offset from the upper surface of the select gate electrode 220b by a distance 221.

In some embodiments, the charge trapping dielectric structure 114 may comprise an ONO structure. In such embodiments, the tunnel dielectric layer 114a may comprise an oxide, the charge trapping dielectric layer 114b may comprise a nitride, and the blocking dielectric layer 114c may comprise an oxide. In other embodiments, the charge trapping dielectric structure 114 may comprise an oxide-nano-crystal-oxide (ONCO) structure. In such embodiments, the tunnel dielectric layer 114a may comprise an oxide, the charge trapping dielectric layer 114b may comprise a layer of crystal nano-dots (e.g., silicon dots), and the blocking dielectric layer 114c may comprise an oxide.

The logic region 234 comprises a transistor device 236 having a logic gate electrode 220x vertically separated from a logic well region 238 within the substrate 102 by way of a thermal gate dielectric layer 240 (i.e., a gate dielectric layer formed by a thermal growth process) and one or more additional gate dielectric layers 216x and/or 218x. The logic gate electrode 220x is laterally arranged between source/drain regions 244 within the logic well region 238. In some embodiments, an upper surface of the substrate 102 within the logic region 234 may be vertically depressed by a distance 242 relative to a substantially planar upper surface of the substrate 102 within the embedded memory region 302.

Isolation regions 214 may be arranged within the substrate 102 on opposing sides of the embedded flash memory cell. In various embodiments, the isolation regions 214 may comprise shallow trench isolation (STI) regions, deep trench isolation (DTI) regions, implant isolation regions, field oxide regions, etc. In some embodiments, a silicide layer 222 may be arranged on the source/drain regions, 206 and/or 244. The silicide layer 222 may comprise a nickel silicide, for example.

In some embodiments, dielectric sidewall spacers may be arranged along sidewalls of the control gate 202, the select gate 204, and the transistor device 236. In some embodiments, the dielectric sidewall spacers may comprise first sidewall spacers 224 and second sidewall spacers 226 arranged along outermost sidewalls of the first sidewall spacers 224. In some embodiments, the first sidewall spacers 224 and/or the second sidewall spacers 226 may comprise a nitride. In other embodiments, the first sidewall spacers 224 and/or the second sidewall spacers 226 may comprise a high-k dielectric material such as hafnium oxide, hafnium silicon oxide, hafnium aluminum oxide, hafnium tantalum oxide, zirconium silicate, or zirconium oxide, for example.

An inter-level dielectric (ILD) layer 228 is arranged over the substrate 102. In some embodiments, the ILD layer 228 may comprise phosphosilicate glass (PSG), for example. Conductive contacts 230 vertically extend through the ILD layer 228 to one or more of the source/drain regions, 206 and 244, and/or one or more of the gate electrodes 220a, 220b, and/or 220x. The conductive contacts 230 may comprise tungsten, copper, aluminum copper, or some other conductive material.

Figure 3:
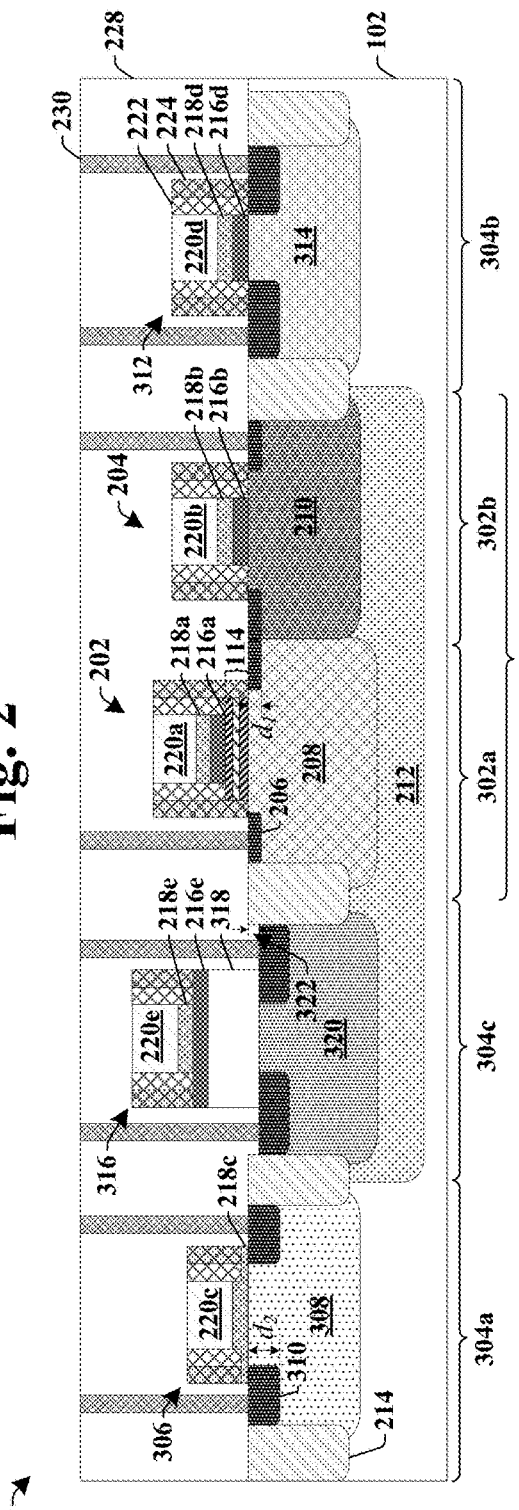
FIG. 3 illustrates a cross-sectional view of some additional embodiments of an integrated chip comprising an embedded flash memory cell.

FIG. 3 illustrates a cross-sectional view of some additional embodiments of an integrated chip 300 having an embedded flash memory cell.

The integrated chip 300 comprises an embedded memory region 302 and one or more logic regions 304a-304c. The embedded memory region 302 comprises an embedded memory device having a control gate region 302a and a select gate region 302b. The control gate region 302a comprises a control gate 202 having a control gate electrode 220a separated from a substrate 102 by a charge trapping dielectric structure 114, a dual-gate dielectric layer 216a, and a single-gate dielectric layer 218a. The select gate region 302b comprises a select gate 204 having a select gate electrode 220b separated from the substrate 102 by a dual-gate dielectric layer 216b and a single-gate dielectric layer 218b. Source/drain regions 206 are arranged in an upper surface the substrate 102 on opposite sides of the control gate 202 and the select gate 204.

In some embodiments, the one or more logic regions 304a-304c may comprise a single-gate-dielectric region 304a having one or more single-gate-dielectric transistors 306, a dual-gate-dielectric region 304b having one or more dual-gate-dielectric transistors 312, and/or a high voltage region 304c having one or more high voltage transistors 316. In some embodiments, the one or more logic regions 304a-304c are laterally spaced from one another by isolation regions 214. Although the embedded memory region 302 and the one or more logic regions 304a-304c are illustrated as being laterally adjacent to one another it will be appreciated that in some embodiments, the embedded memory region 302 and the one or more logic regions 304a-304c may be located within different parts of an integrated chip.

The single-gate-dielectric transistor 306 comprises a single-gate-dielectric electrode 220c that is vertically separated from the substrate 102 by way of a single-gate-dielectric layer 218c having a first thickness. In some embodiments, the single-gate-dielectric electrode 220c is vertically separated from a single-gate well 308 disposed within the substrate 102 and having the second doping type.

The dual-gate-dielectric transistor 312 comprises a dual-gate-dielectric electrode 220d that is vertically separated from the substrate 102 by way of a single-gate dielectric layer 218d and a dual-gate dielectric layer 216d. In some embodiments, the dual-gate-dielectric electrode 220d is vertically separated from a dual-gate well 314 disposed within the substrate 102 and having the second doping type. The single-gate dielectric layer 218d and a dual-gate dielectric layer 216d collectively have a second thickness, which is configured to provide the dual-gate-dielectric transistor 312 with a higher breakdown voltage than the single-gate-dielectric transistor 306.

The high voltage transistor 316 comprises a high voltage gate electrode 220e that is vertically separated from the substrate 102 by way of a single-gate dielectric layer 218e, a dual-gate dielectric layer 216e, and a high voltage gate dielectric layer 318. In some embodiments, the high voltage gate electrode 220e is vertically separated from a high voltage well 320 disposed within the substrate 102 and having the second doping type. The single-gate dielectric layer 218e, the dual-gate dielectric layer 216e, and the high voltage gate dielectric layer 318 collectively have a third thickness, which is configured to provide the high voltage transistor 316 with a higher breakdown voltage than the dual-gate-dielectric transistor 312.

In some embodiments, an upper surface of the substrate 102 within the high voltage region 304c may be vertically depressed by a distance 322 relative to a substantially planar upper surface of the substrate 102 within the embedded memory region 302. In some embodiments, the upper surface of the substrate 102 within the high voltage region 304c may also be vertically depressed relative to upper surfaces of the substrate 102 within the single-gate-dielectric region 304a and the dual-gate-dielectric region 304b. In some embodiments, the upper surfaces of the substrate 102 within the single-gate-dielectric region 304a and the dual-gate-dielectric region 304b may be substantially planar to the upper surface of the substrate 102 within the embedded memory region 302.

Source/drain regions 310 are disposed within the single-gate well 308, the dual-gate well 314, and the high voltage well 320. In some embodiments, the source/drain regions 310 may have a second depth $d_2$ that is greater than a first depth $d_1$ of the source/drain regions 206 within the embedded memory region 302. In some embodiments, the control gate electrode 220a and the select gate electrode 220b may comprise a first material, while the single-gate-dielectric electrode 220c, the dual-gate-dielectric electrode 220d, and the high voltage gate electrode 220e may comprise different second material. In some embodiments, the first material is polysilicon and the second material is a metal (e.g., titanium, tantalum, tungsten, copper, aluminum copper, or aluminum, etc.).

Figure 4A:
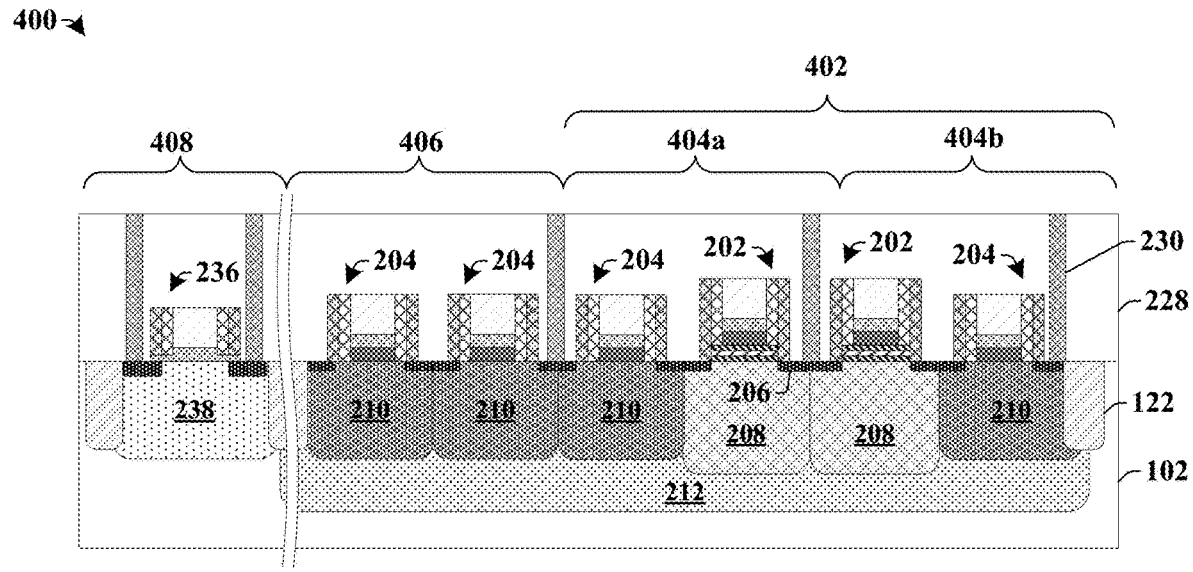
FIGS. 4A-4B illustrates some additional embodiments of an integrated chip comprising an array of embedded flash memory cells.
Figure 4B:
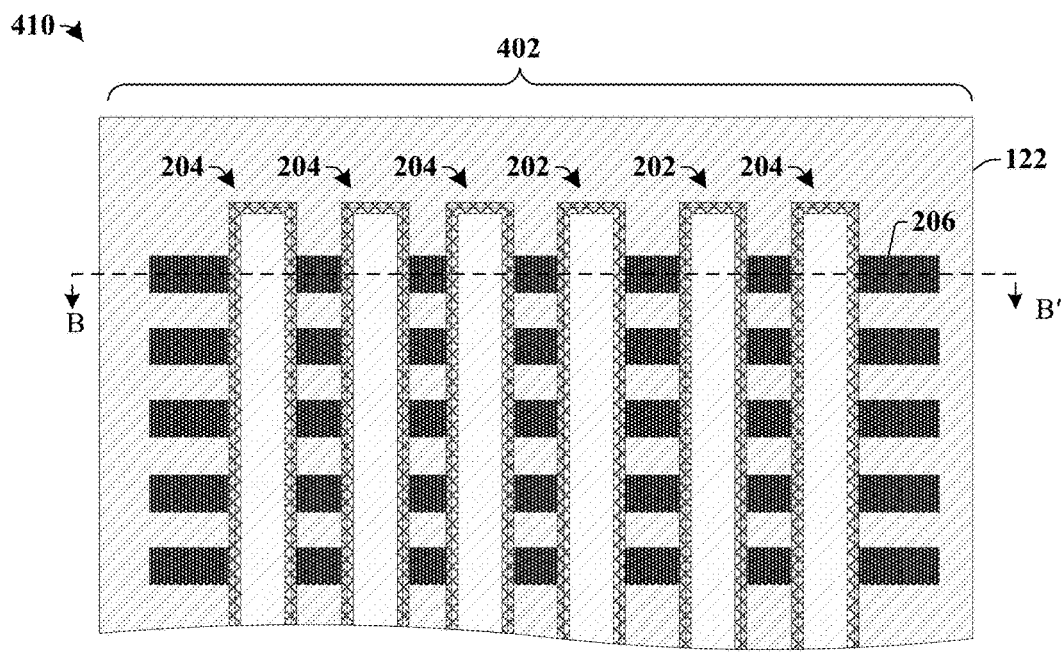

FIGS. 4A-4B illustrate some embodiments of an integrated chip having an array of embedded flash memory cells.

FIG. 4A illustrates a cross-sectional view 400 of an integrated chip having an array of embedded flash memory cells. FIG. 4B illustrates a top-view 410 of the integrated chip of FIG. 4A. As shown in cross-sectional view 400, the integrated chip comprises a memory region 402 arranged within a substrate 102 at a location laterally separated from a logic region 408. The memory region 402 comprises a plurality of memory cells 404a-404b arranged in an array, and respectively having a control gate 202 and a select gate 204. In some embodiments, the control gates 202 may be arranged adjacent to one another. In such embodiments, the control gates 202 and the select gates 204 may share an intervening source/drain region 206.

The logic region 408 comprises one or more transistor devices 236 (e.g., single-gate-dielectric transistors, dual-gate-dielectric transistors, high voltage transistors, etc.). In some embodiments, the logic region 408 may be separated from the memory cells 404a-404b by way of a dummy region 406 having one or more select gates 204 that are not operated as memory cells. In some embodiments, the dummy region 406 may be arranged within the array structure of the memory region 402.

FIGS. 5-22 illustrate a series of cross-sectional views 500-2200 of some embodiments of a method for manufacturing an integrated chip comprising an embedded flash memory cell. Although the cross-sectional-views shown in FIGS. 5-22 are described with reference to a method of forming an embedded flash memory cell, it will be appreciated that the structures shown in the figures are not limited to the method of formation but rather may stand alone separate of the method.

Figure 5:
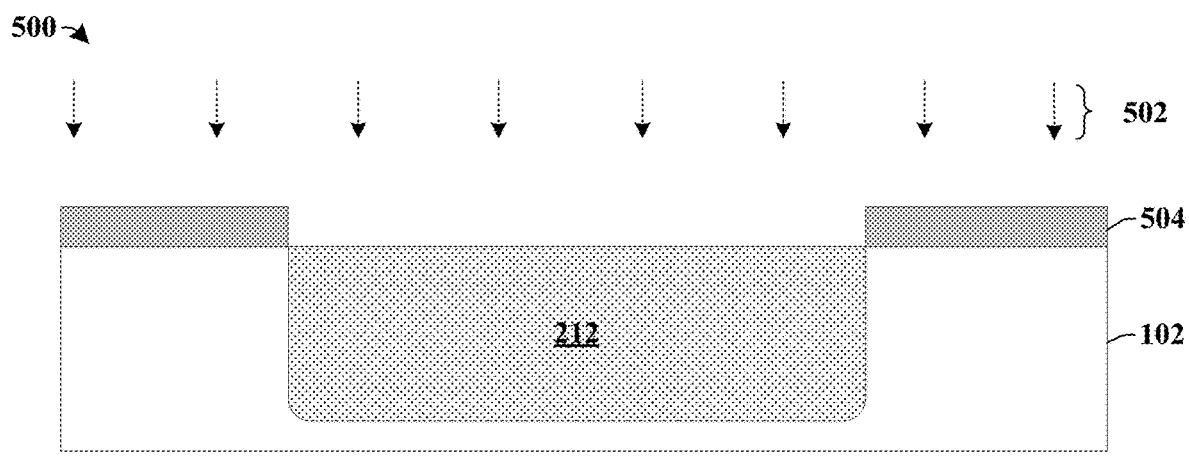
FIGS. 5-22 illustrate cross-sectional views of some embodiments of a method of forming an integrated chip comprising an embedded flash memory cell.

As illustrated in cross-sectional view 500 of FIG. 5, a deep well 212 is formed within a substrate 102. The substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the deep well 212 may be formed by selectively implanting a dopant species 502 having a second doping type into the substrate 102 having a first doping type (e.g., an n-type deep well may be formed within a p-type substrate, to form a PMOS active area, by implanting a n-type dopant into the substrate). In some embodiments, the dopant species 502 may be selectively implanted into the substrate 102 according to a first masking layer 504. In some embodiments, the first masking layer 504 may comprise a patterned photoresist layer.

Figure 6:
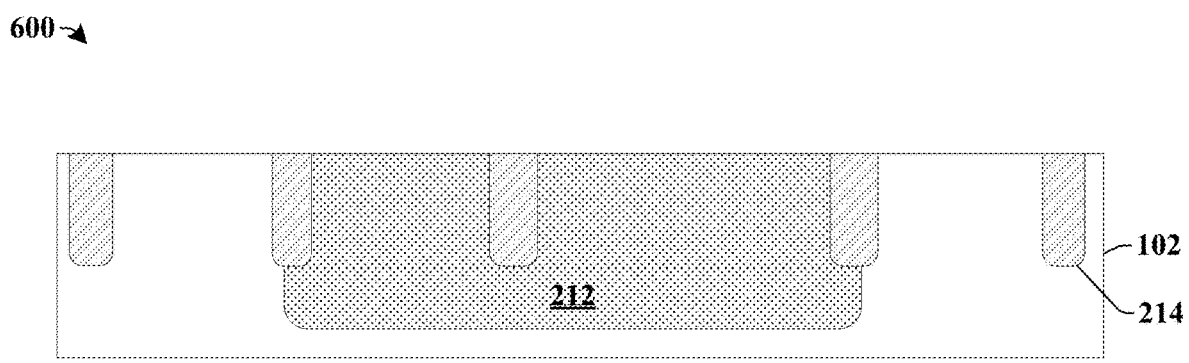

As illustrated in cross-sectional view 600 of FIG. 6, a plurality of isolation regions 214 are formed within an upper side of a substrate 102. In some embodiments, the plurality of isolation regions 214 may be formed by selectively etching the substrate 102 to form trenches and subsequently filling the trenches with a dielectric material (e.g., an oxide).

Figure 7:
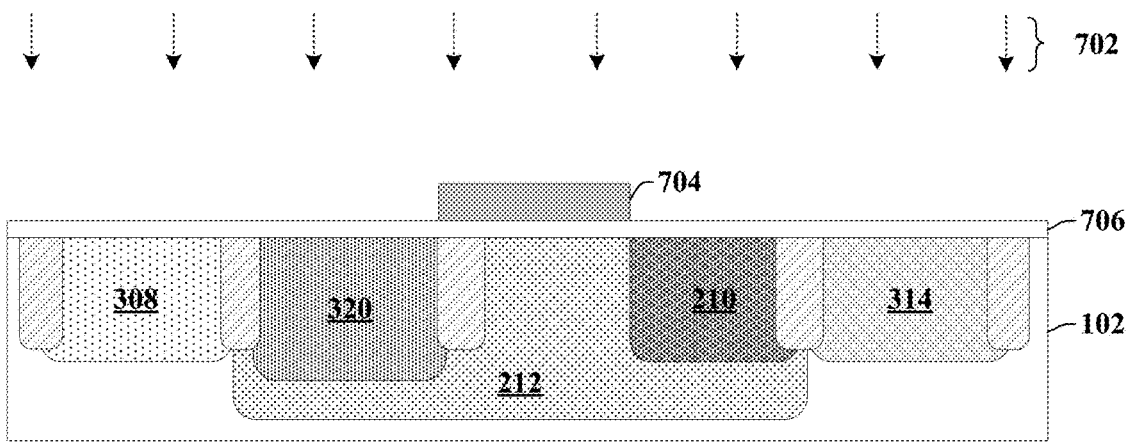

As illustrated in cross-sectional view 700 of FIG. 7, one or more wells 308, 210, 314, and/or 320 are formed within the substrate 102. The one or more wells may comprise a select well 210, a single-gate well 308, a dual-gate well 314, and a high voltage well 320. The one or more wells 308, 210, 314, and/or 320 may be formed by selectively implanting one or more dopant species 702 having the first doping type (using one or more separate implantation processes) into the substrate 102. In some embodiments, the one or more dopant species 702 may be selectively implanted into the substrate 102 according to a second masking layer 704 (e.g., a photoresist layer). In some embodiments, a sacrificial dielectric layer 706 may be formed over the substrate 102 prior to the implantations to regulate a depth of the implantations.

Figure 8:
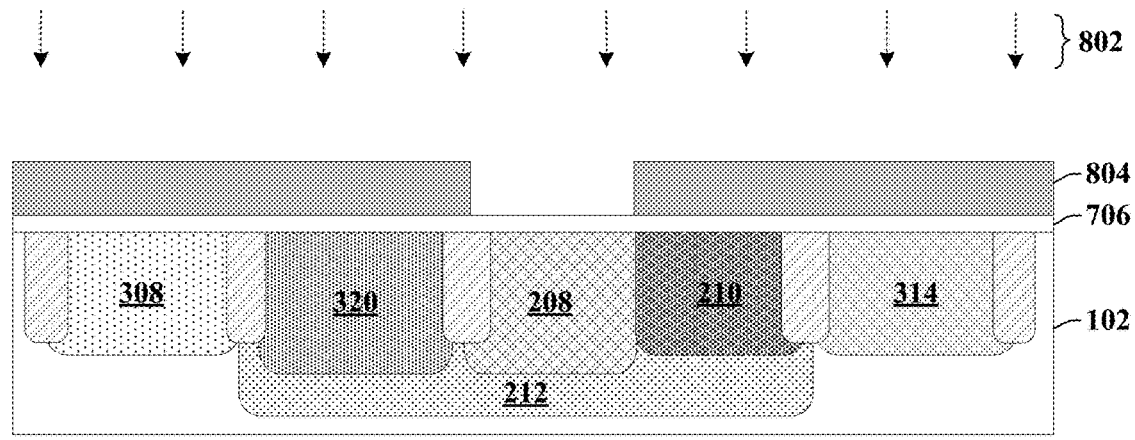

As illustrated in cross-sectional view 800 of FIG. 8, a control well 208 is formed within the substrate 102. The control well 208 may be formed by selectively implanting one or more dopant species 802 into the substrate 102 according to a third masking layer 804 (e.g., a photoresist layer). In some embodiments, the control well 208 and the select well 210 may comprise a same doping type and different doping concentrations.

Figure 9:
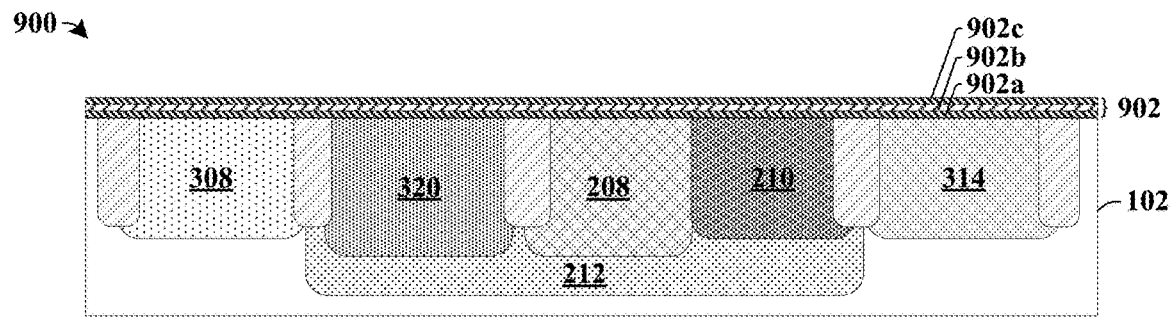

As illustrated in cross-sectional view 900 of FIG. 9, a charge trapping dielectric structure 902 is formed over the substrate 102. In some embodiments, the charge trapping dielectric structure 902 comprises a tunnel dielectric layer 902a, a charge trapping layer 902b formed over the tunnel dielectric layer 902a, and a blocking dielectric layer 902c formed over the charge trapping layer 902b. The tunnel dielectric layer 902a and the blocking dielectric layer 902c may comprise an oxide (e.g., silicon dioxide), and the charge trapping layer 902b may comprise a nitride or nano-crystals (e.g., quantum dots). The tunnel dielectric layer 902a may be formed by a thermal growth process or by way of a deposition process (e.g., chemical vapor deposition (CVD), physical vapor deposition (PVD), and/or atomic layer deposition (ALD)), while the charge trapping layer 902b and the blocking dielectric layer 902c may be formed by way of deposition processes (e.g., CVD, PVD, and/or ALD).

In some embodiments, the sacrificial dielectric layer 706 (as shown in FIG. 8) may be removed from over the control well 208 prior to formation of the charge trapping dielectric structure 902, but be kept in regions outside of the control well 208 (e.g., so that the charge trapping dielectric structure 902 is formed over the control well 208 and over the sacrificial dielectric layer 706 in areas outside of the control well 208).

Figure 10:
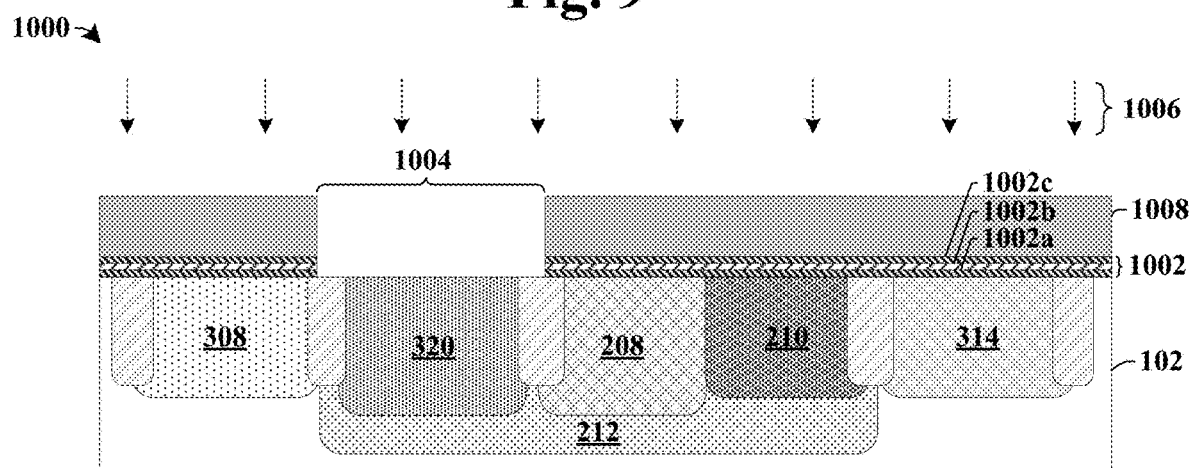

As illustrated in cross-sectional view 1000 of FIG. 10, a first charge trapping dielectric etching process is performed to form an opening 1004 in the charge trapping dielectric structure 1002. The opening 1004 overlies the high voltage well 320. In some embodiments, the first charge trapping dielectric etching process may be performed by selectively exposing the charge trapping dielectric structure 1002 to one or more etchants 1006 according to a fourth masking layer 1008.

Figure 11A:
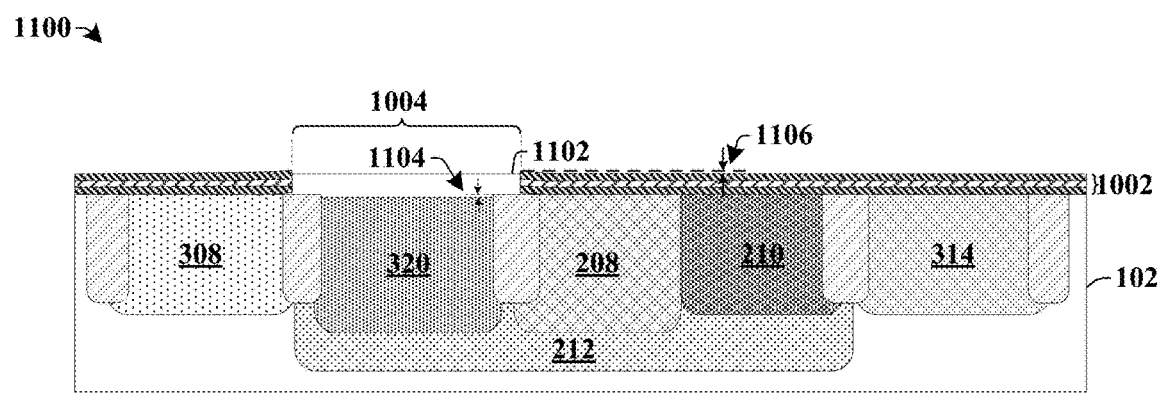

As illustrated in cross-sectional view 1100 of FIG. 11A, a high voltage gate dielectric layer 1102 is formed over the high voltage well 320 within the substrate 102. In some embodiments, the high voltage gate dielectric layer 1102 is formed by a thermal growth process. The charge trapping dielectric structure 1002 blocks (i.e., mitigates) the thermal growth process within an embedded memory region 302 comprising the control well 208 and the select well 210. Blocking the thermal growth process within the embedded memory region 302 results in vertically offset surfaces between the high voltage well 320 and the embedded memory region 302, since a part of the substrate 102 over the high voltage well 320 is consumed during the thermal growth process. For example, the substrate 102 may comprise an upper surface, overlying the high voltage well 320, which is recessed by a distance 1104 relative to a substantially planar upper surface within the embedded memory region 302. In various embodiments, the thermal growth process may comprise a wet thermal growth process or a dry thermal growth process.

Furthermore, since the charge trapping dielectric structure 1002 blocks the thermal growth process within the embedded memory region 302 (e.g., over the select gate well 210), thermal oxide encroachment and oxidation enhanced diffusion are reduced on the tunnel dielectric layer 1002a within the embedded memory region 302, resulting in a tunnel dielectric layer having a relatively uniform thickness.

Figure 11B:
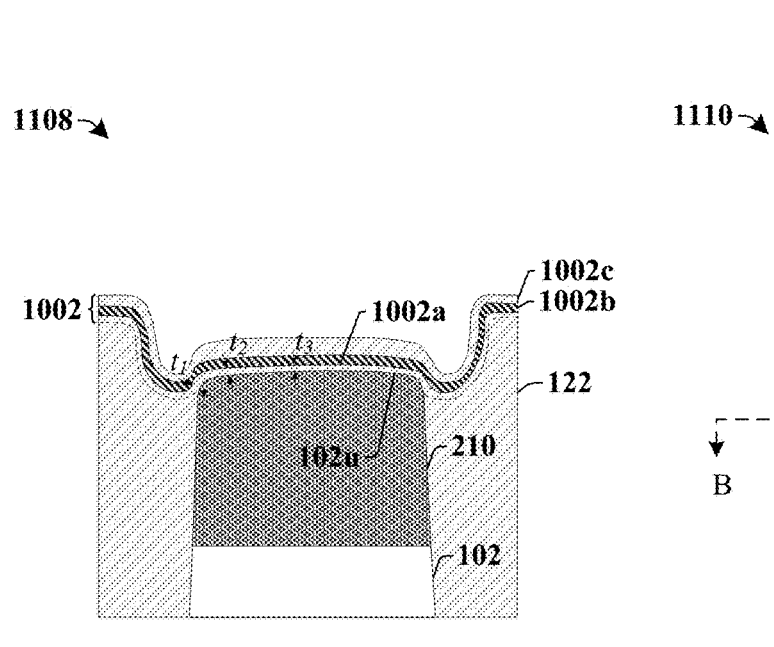
Figure 11C:
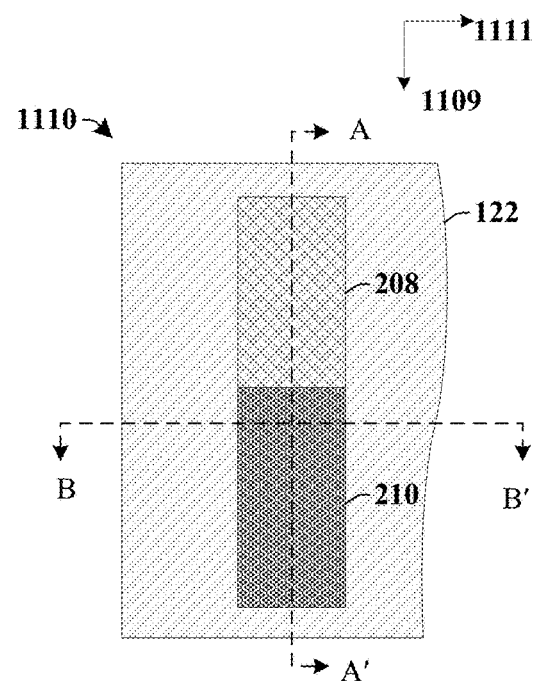
Figure 11D:
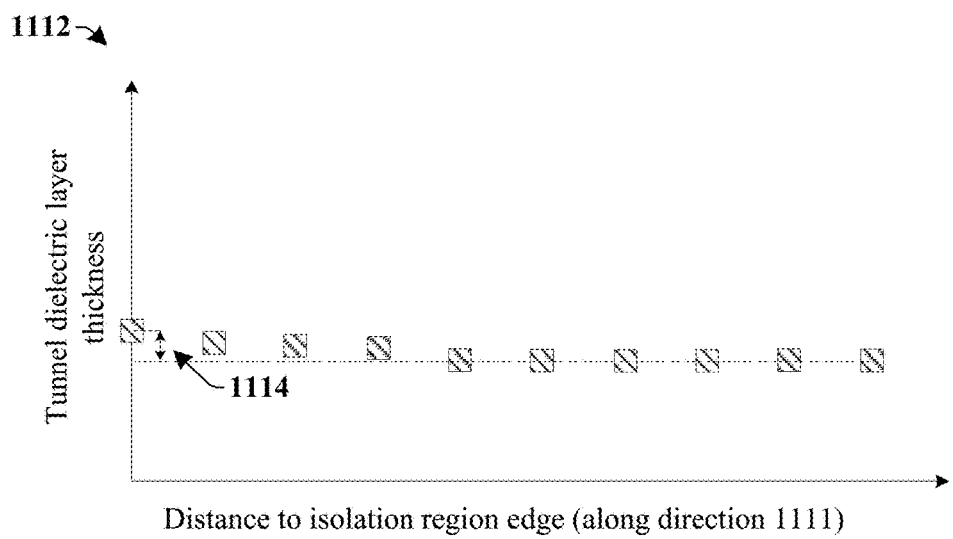

For example, FIG. 11C illustrates a top-view 1110 of the integrated chip of the memory region 302 shown in cross-sectional view 1100 (FIG. 11A is shown along cross-sectional line A-A' of FIG. 11C extending along a first direction 1109). FIG. 11B illustrates a cross-sectional view 1108 of the integrated chip along a second direction 1111 (along cross-sectional line B-B' of FIG. 11C). As shown in cross-sectional view 1108, and the graph 1112 of FIG. 11D, the tunnel dielectric layer 1002a has a thickness that decreases along the second direction 1111 as a distance from an isolation region 122 increases. The thicknesses of the tunnel dielectric layer 114a may change by an amount 1114 less than 25% between the first thickness $t_1$ and the third thickness $t_3$.

The result of the reduction of oxidation encroachment on the tunnel dielectric layer 1002a also results in a substantially flat charge trapping dielectric structure 1002 along the first direction 1109, as shown in cross-sectional view 1100. For example, while the charge trapping dielectric structure 1002 may have higher outside corners, the corners are elevated at a distance 1106 that is within a range of between approximately 20% and approximately 50% of a height of the charge trapping dielectric structure 1002 at a center (in contrast to single step charge trapping dielectric etching process which result in corners having birds peaks that are elevated in a range of between approximately 100% and approximately 200% of a height at a center of the charge trapping dielectric structure 1002).

Figure 12:
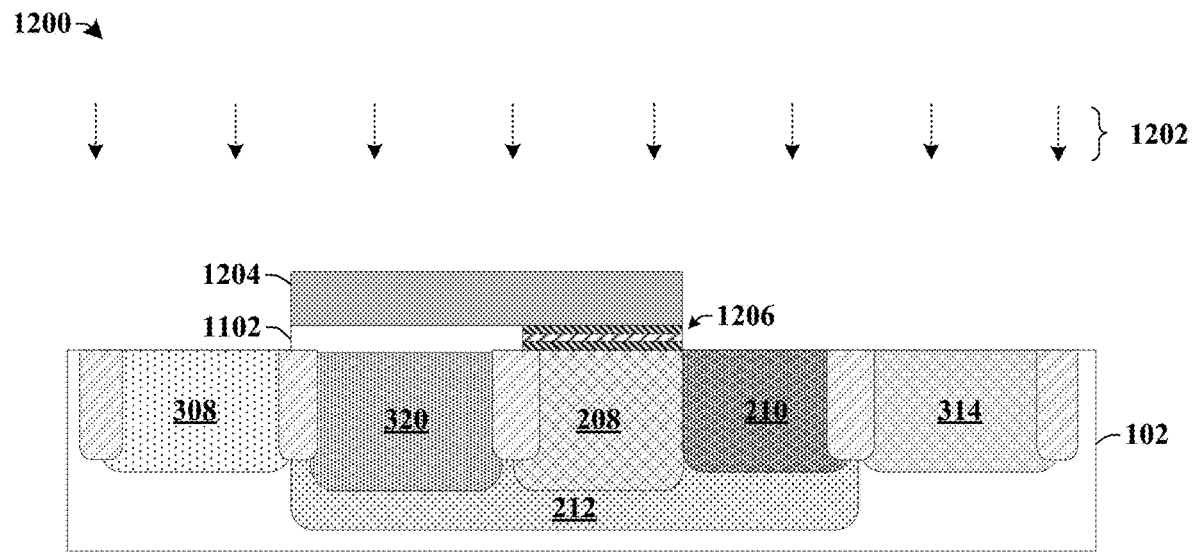

As illustrated in cross-sectional view 1200 of FIG. 12, a second charge trapping dielectric etching process is performed to remove the charge trapping dielectric structure 114 in areas outside of the control well 208. In some embodiments, the second charge trapping dielectric etching process may be performed by selectively exposing the charge trapping dielectric structure 1206 to one or more etchants 1202 according to a fifth masking layer 1204 (e.g., a photoresist layer) covering the charge trapping dielectric structure 114 over the control well 208 and the high voltage gate dielectric layer 1102 over the high voltage well 320.

Figure 13:
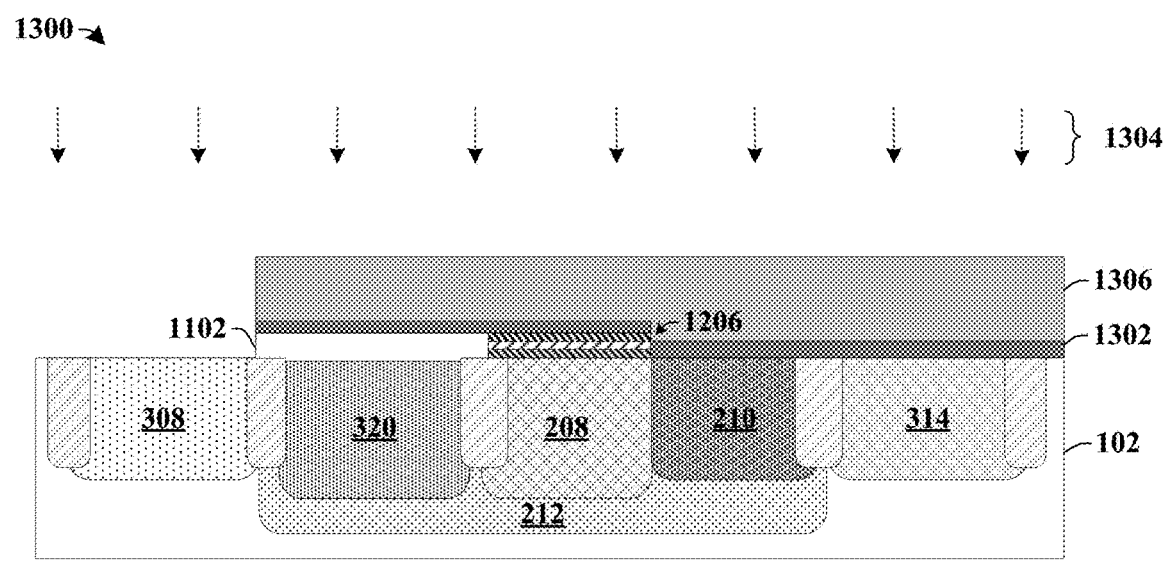

As illustrated in cross-sectional view 1300 of FIG. 13, a dual-gate dielectric layer 1302 is formed over the substrate 102. The dual-gate dielectric layer 1302 may comprise an oxide (e.g., silicon dioxide). In some embodiments, the dual-gate dielectric layer 1302 may be formed by a blanket deposition process (e.g., a CVD process, a PE-CVD process, a PVD process, or an ALD process). After formation, the dual-gate dielectric layer 1302 is subsequently removed from over the single-gate well 308. In some embodiments, the dual-gate dielectric layer 1302 may be removed from over the single-gate well 308 by selectively exposing the dual-gate dielectric layer 1302 to one or more etchants 1304 according to a sixth masking layer 1306 having an opening overlying the single-gate well 308.

Figure 14:
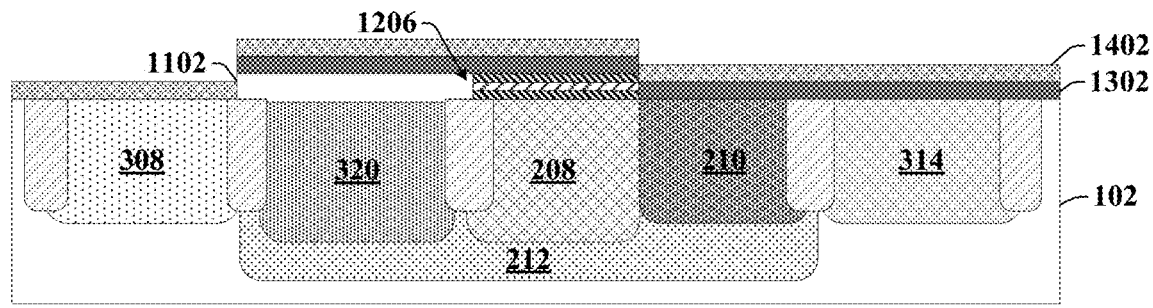

As illustrated in cross-sectional view 1400 of FIG. 14, a single-gate-dielectric layer 1402 is formed over the substrate 102. The single-gate-dielectric layer 1402 may comprise an oxide (e.g., silicon dioxide). In some embodiments, the single-gate-dielectric layer 1402 may be formed by a blanket deposition process (e.g., a CVD process, a PE-CVD process, a PVD process, or an ALD process).

Figure 15:
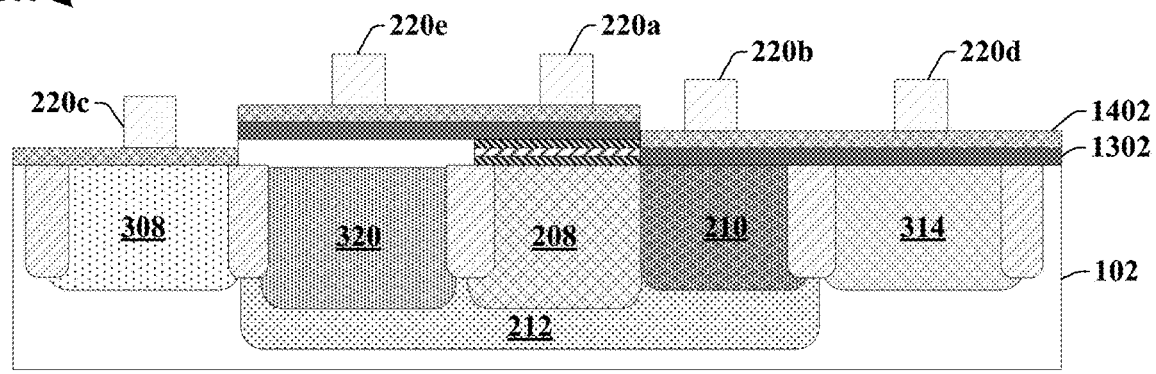

As illustrated in cross-sectional view 1500 of FIG. 15, a plurality of gate electrodes 220a-220e are formed over the single-gate dielectric layer 1402. The plurality of gate electrodes 220a-220e may be formed by depositing a conductive layer over the single-gate-dielectric layer 1402 by way of a vapor deposition process (e.g., CVD, PVD, or ALD). In various embodiments, the conductive layer may comprise doped polysilicon or some other conductive material. The conductive layer may be subsequently etched to form a control gate electrode 220a, a select gate electrode 220b, a single-gate-dielectric electrode 220c, a dual-gate-dielectric electrode 220d, and a high voltage gate electrode 220e.

Figure 16:
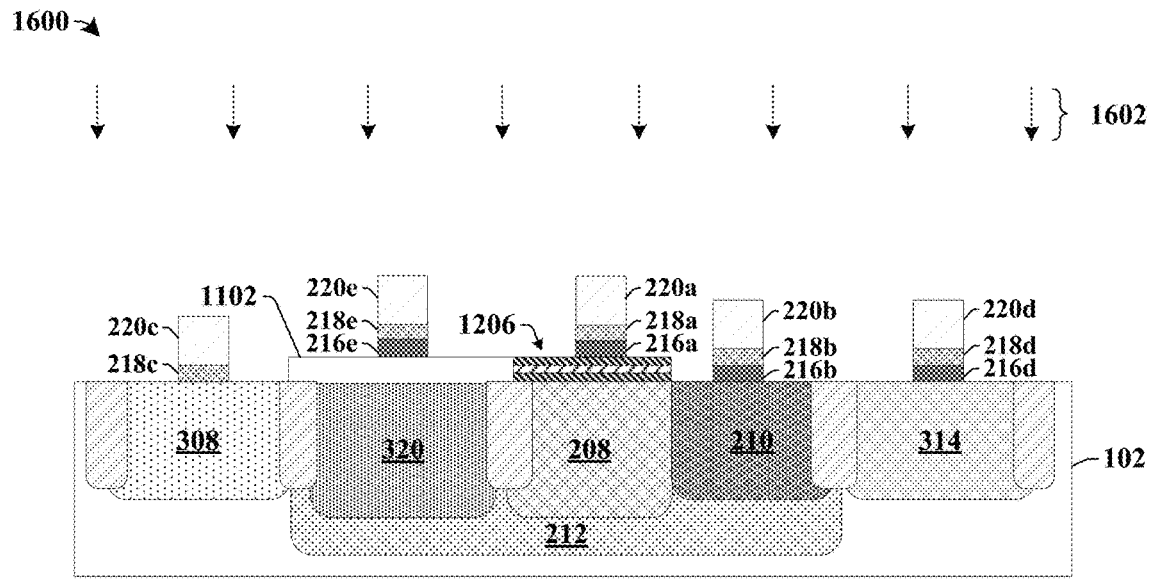

As illustrated in cross-sectional view 1600 of FIG. 16, the single-gate-dielectric layer and the dual-gate dielectric layer are selectively etched by exposing the single-gate-dielectric layer and the dual-gate dielectric layer to one or more etchants 1602 while using the plurality of gate electrodes 220a-220e as a mask. The etching process confines the single-gate-dielectric layer and the dual-gate dielectric layer below the control gate electrode 220a, the select gate electrode 220b, the dual-gate-dielectric electrode 220d, and the high voltage gate electrode 220e. The etching process also confines the single-gate-dielectric layer below the single-gate-dielectric electrode 220c.

Figure 17:
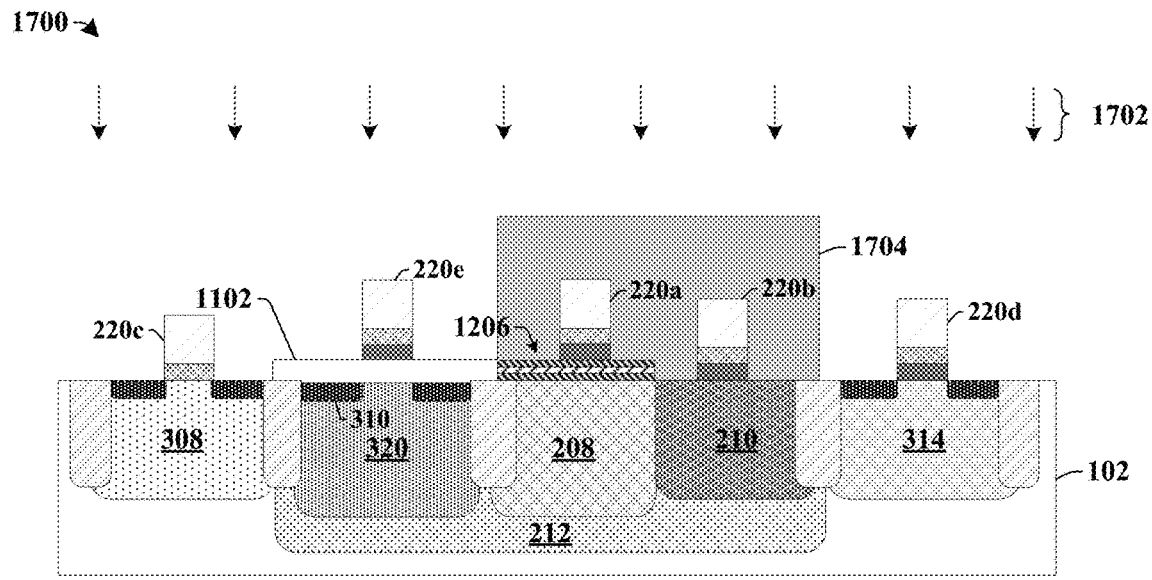

As illustrated in cross-sectional view 1700 of FIG. 17, a first source/drain implantation process is performed to form source/drain regions 310 within the single-gate well 308, the dual-gate well 314, and the high voltage well 320. In some embodiments, the first source/drain implantation process may be performed by selectively implanting a dopant species 1702 into the substrate 102 according to a mask comprising the single-gate-dielectric electrode 220c, the dual-gate-dielectric electrode 220d, the high voltage gate electrode 220e, and a seventh masking layer 1704.

Figure 18:
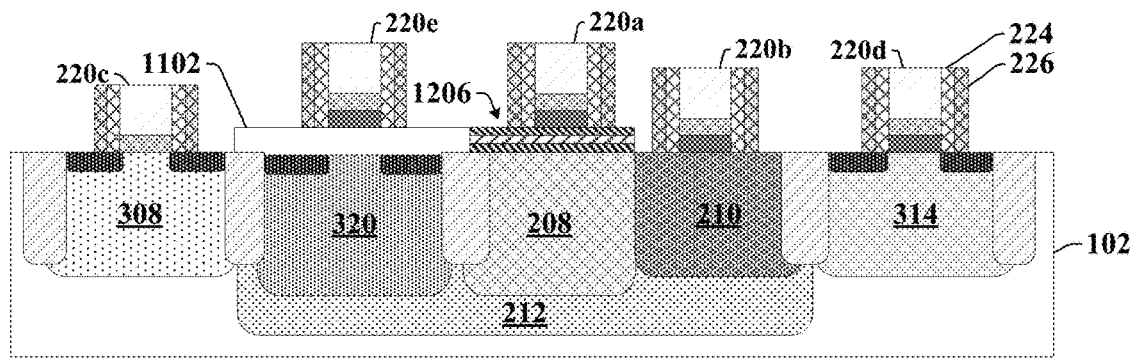

As illustrated in cross-sectional view 1800 of FIG. 18, one or more sidewalls spacers 224-226 are formed on opposing sides of the plurality of gate electrodes 220a-220e. In some embodiments, the one or more sidewalls spacers 224-226 may comprise first sidewall spacers 224 and second sidewall spacers 226. The first sidewall spacers 224 and the second sidewall spacers 226 may respectively be formed by depositing a nitride or oxide based material onto the substrate 102, and selectively etching the nitride or oxide based material to form the first sidewall spacer 224 and the second sidewall spacer 226.

Figure 19:
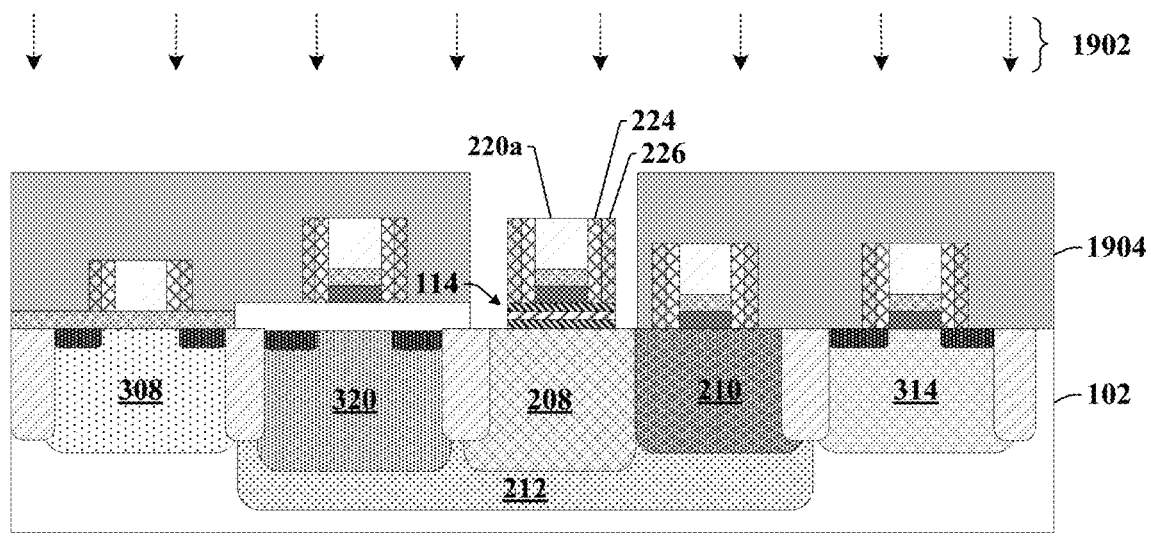

As illustrated in cross-sectional view 1900 of FIG. 19, the charge trapping dielectric structure 114 is selectively etched by exposing the charge trapping dielectric structure 114 to one or more etchants 1902 while using the control gate electrode 220a, the one or more sidewalls spacers 224-226 surrounding the control gate electrode 220a, and an eighth masking layer 1904 as a mask. The etching process confines the charge trapping dielectric structure 114 below the control gate electrode 220a and the one or more sidewalls spacers 224-226 surrounding the control gate electrode 220a.

Figure 20:
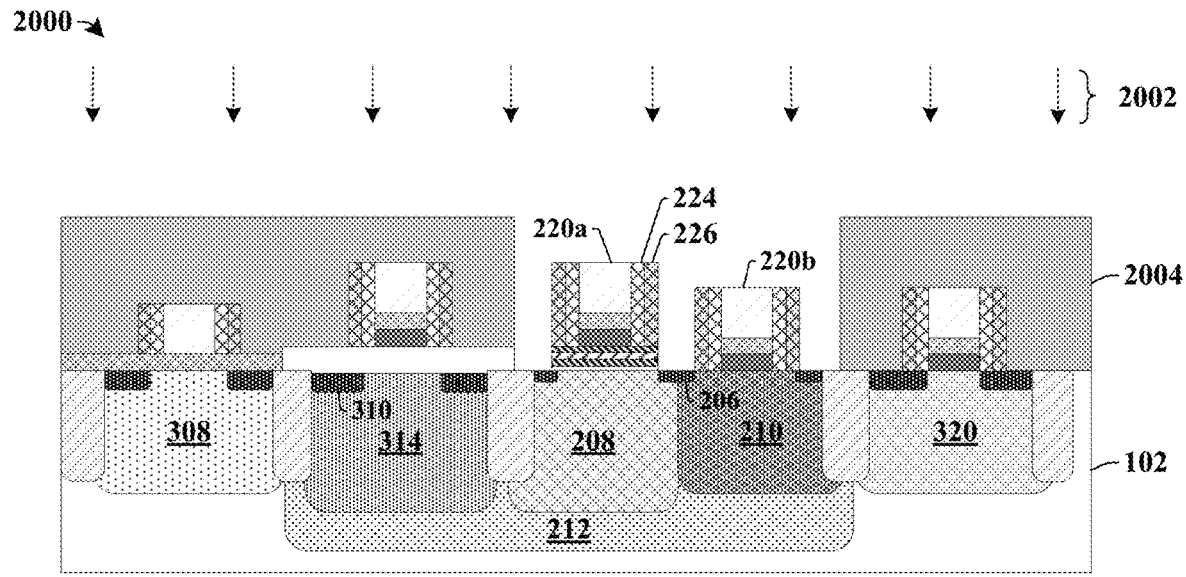

As illustrated in cross-sectional view 2000 of FIG. 20, a second source/drain implantation process is performed to form source/drain regions 206 within the control well 208 and the select well 210. In some embodiments, the second source/drain implantation process may be performed by selectively implanting a dopant species 2002 into the substrate 102 according to the control gate electrode 220a, the select gate electrode 220b, sidewall spacers 224-226 surrounding the control gate electrode 220a and the select gate electrode 220b, and a ninth masking layer 2004. In some embodiment, the second source/drain implantation process may form source/drain regions 206 comprising lightly doped source/drain regions having a shallower depth and a lower doping concentration than the source/drain regions 310 within the single-gate well 308, the dual-gate well 314, and the high voltage well 320.

Figure 21:
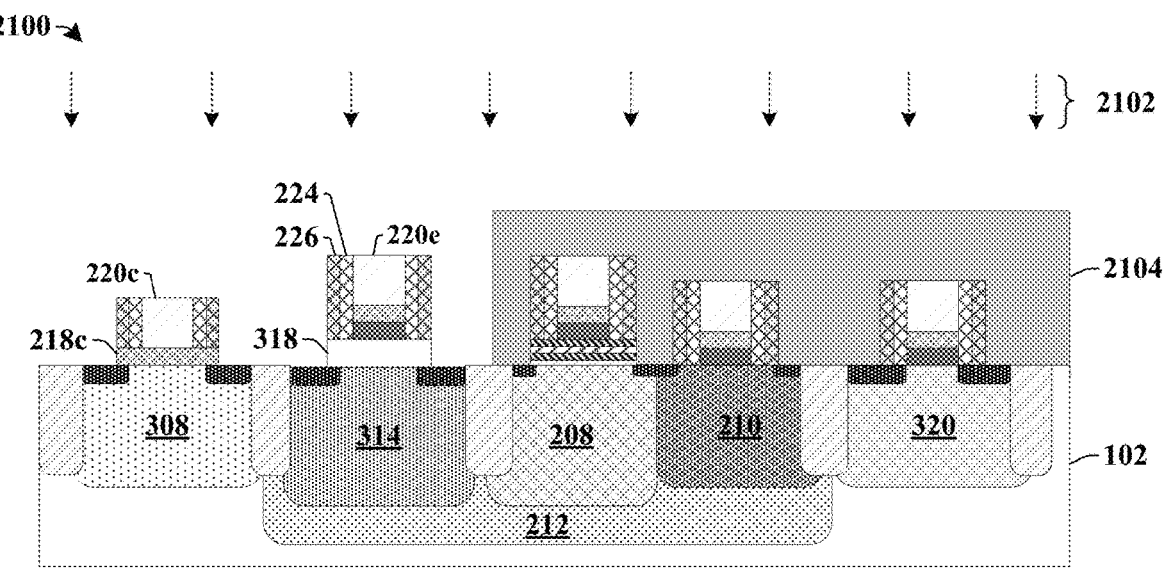

As illustrated in cross-sectional view 2100 of FIG. 21, the high voltage gate dielectric layer 318 is selectively etched by exposing the high voltage gate dielectric layer 318 to one or more etchants 2102 while using the high voltage gate electrode 220e, sidewalls spacers 224-226 surrounding the high voltage gate electrode 220e, and a tenth masking layer 2104 as a mask. The etching process confines the high voltage gate dielectric layer 318 below the high voltage gate electrode 220e and the sidewalls spacers 224-226 surrounding the high voltage gate electrode 220e.

Figure 22:
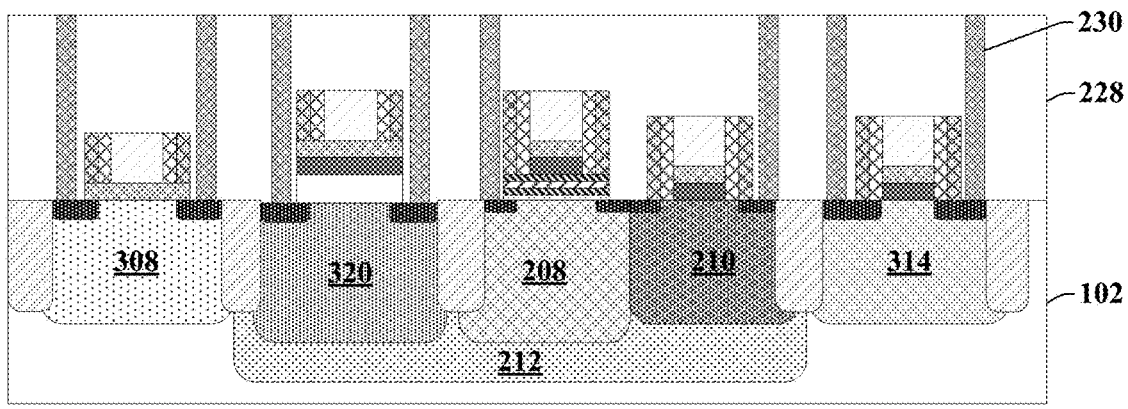

As illustrated in cross-sectional view 2200 of FIG. 22, an inter-level dielectric (ILD) layer 228 is formed over the substrate 102. The ILD layer 228 may comprise an oxide, PSG, a low κ dielectric, or some other dielectric, and may be formed by vapor deposition process (e.g., CVD, PVD, or ALD). Conductive contacts 230 are formed within the ILD layer 228. The conductive contacts 230 extend from a top surface of the ILD layer 228 to the source/drain regions 206 and/or 310 and/or to the control gate electrode 220a, the select gate electrode 220b, the single-gate-dielectric electrode 220c, the dual-gate-dielectric electrode 220d, and/or the high voltage gate electrode 220e. In some embodiments, the conductive contacts 230 may be formed by selectively etching the first ILD layer to form a plurality of openings. The plurality of openings are subsequently filled with a conductive material to form the plurality of conductive contacts. A planarization process (e.g., a chemical mechanical polishing process) may be performed after forming the conductive material to co-planarize upper surfaces of the ILD layer 228 and the third conductive layer. In various embodiments, the conductive material may comprise tungsten, copper, aluminum copper, or some other conductive material.

Figure 23:
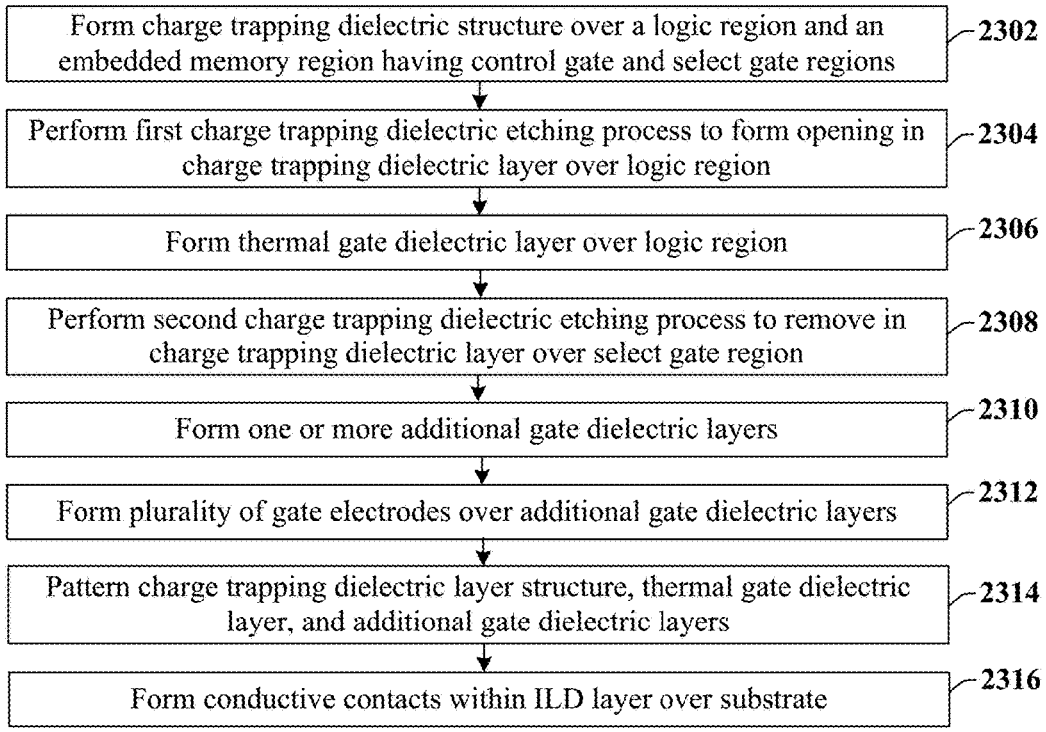
FIG. 23 illustrates some embodiments of a method of forming an integrated chip comprising an embedded flash memory cell.

FIG. 23 illustrates a flowchart of some embodiments of a method 2300 of forming an integrated chip comprising a flash memory cell.

Although the disclosed methods (e.g., methods 2300 and 2400) are described in relation to FIGS. 5-22, it will be appreciated that the methods are not limited to such structures. Furthermore, while the disclosed methods are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2302, a charge trapping dielectric structure is formed over a logic region and an embedded memory region having control gate and select gate regions. FIG. 9 illustrates some embodiments of a cross-sectional view 900 corresponding to act 2302.

At 2304, a first charge trapping dielectric etching process is performed to form an opening in the charge trapping dielectric structure over the logic region. FIG. 10 illustrates some embodiments of a cross-sectional view 1000 corresponding to act 2304.

At 2306, a thermal gate dielectric layer is formed over the logic region. FIG. 11A illustrates some embodiments of a cross-sectional view 1100 corresponding to act 2306.

At 2308, a second charge trapping dielectric etching process is performed to remove the charge trapping dielectric structure from over the select gate region. FIG. 12 illustrates some embodiments of a cross-sectional view 1200 corresponding to act 2308.

At 2310, one or more additional gate dielectric layers are formed over the substrate. FIGS. 13-14 illustrate some embodiments of cross-sectional views 1300-1400 corresponding to act 2310.

At 2312, a plurality of gate electrodes are formed over one or more additional gate dielectric layers. FIG. 15 illustrates some embodiments of a cross-sectional view 1500 corresponding to act 2312.

At 2314, the charge trapping dielectric structure, the thermal gate dielectric layer, and the additional gate dielectric layers are selectively patterned using the plurality of gate electrodes as a mask. FIG. 16-21 illustrates some embodiments of cross-sectional views 1600-2100 corresponding to act 2314.

At 2316, a plurality of conductive contacts are formed within an ILD layer over the substrate. FIG. 22 illustrates some embodiments of a cross-sectional view 2200 corresponding to act 2316.

Figure 24:
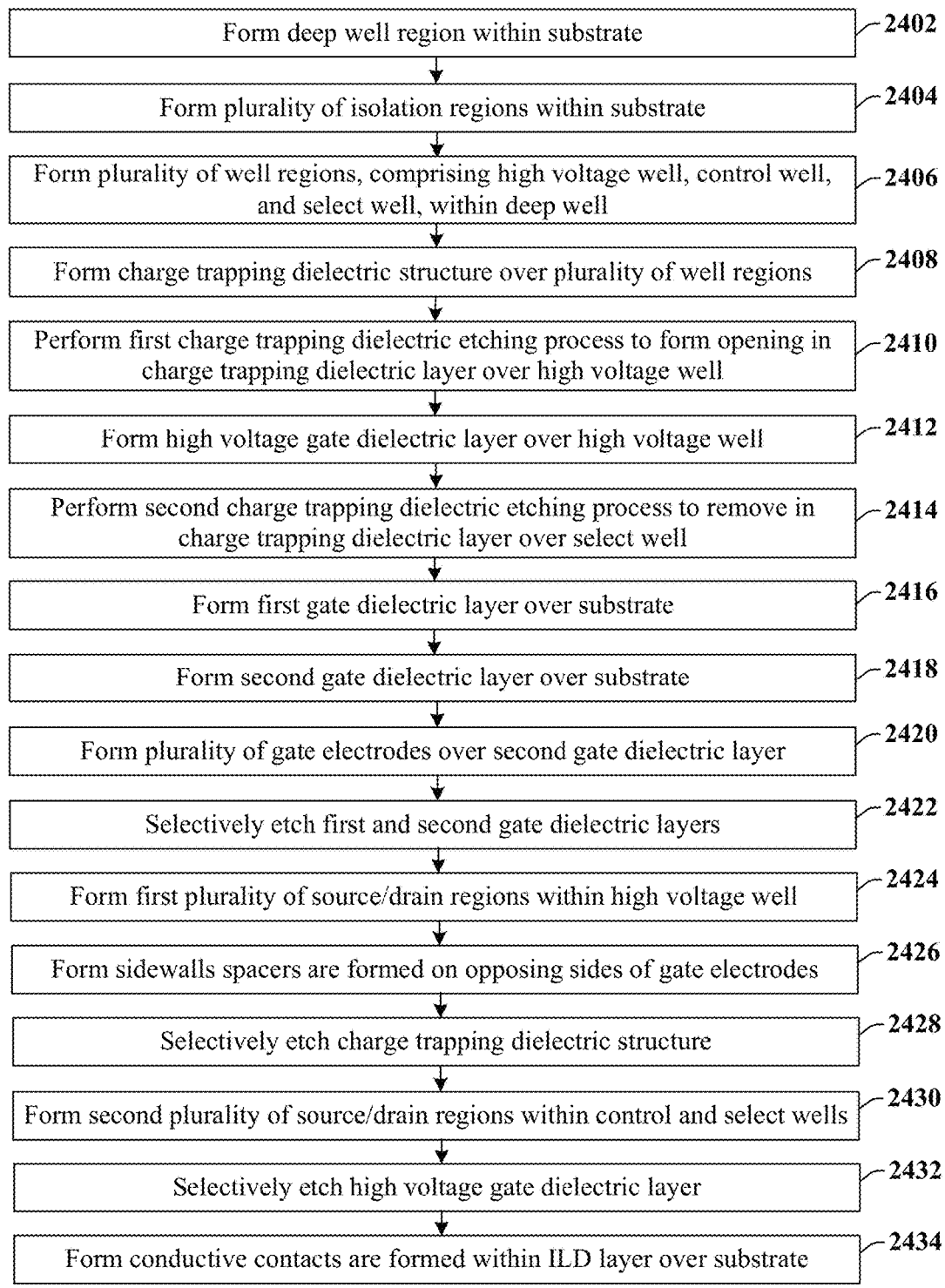
FIG. 24 illustrates some additional embodiments of a method of forming an integrated chip comprising an embedded flash memory cell.

FIG. 24 illustrates a flowchart of some additional embodiments of a method 2400 of forming an integrated chip comprising a flash memory cell.

At 2402, a deep well region may be formed within a substrate. FIG. 5 illustrates some embodiments of a cross-sectional view 500 corresponding to act 2402.

At 2404, a plurality of isolation regions are formed within the substrate. FIG. 6 illustrates some embodiments of a cross-sectional view 600 corresponding to act 2404.

At 2406, a plurality of well regions comprising a high voltage well, a control well, and a select well are formed within the substrate. FIGS. 7-8 illustrate some embodiments of cross-sectional views 700-800 corresponding to act 2406.

At 2408, a charge trapping dielectric structure is formed over the plurality of well regions. FIG. 9 illustrates some embodiments of a cross-sectional view 900 corresponding to act 2408.

At 2410, a first charge trapping dielectric etching process is performed to form an opening in the charge trapping dielectric structure over the high voltage well. FIG. 10 illustrates some embodiments of a cross-sectional view 1000 corresponding to act 2410.

At 2412, a high voltage gate dielectric layer is formed over the high voltage well. FIG. 11 illustrates some embodiments of a cross-sectional view 1100 corresponding to act 2410.

At 2414, a second charge trapping dielectric etching process is performed to remove the charge trapping dielectric structure from over the select well. FIG. 12 illustrates some embodiments of a cross-sectional view 1200 corresponding to act 2414.

At 2416, a first gate dielectric layer (e.g., a dual-gate-dielectric layer) is formed over the substrate. FIG. 13 illustrates some embodiments of a cross-sectional view 1300 corresponding to act 2416.

At 2418, a second gate dielectric layer (e.g., a single-gate-dielectric layer) is formed over the substrate. FIG. 14 illustrates some embodiments of a cross-sectional view 1400 corresponding to act 2418.

At 2420, a plurality of gate electrodes are formed over the second gate dielectric layer. FIG. 15 illustrates some embodiments of a cross-sectional view 1500 corresponding to act 2420.

At 2422, the second gate dielectric layer and the first gate dielectric layer are selectively etched using the plurality of gate electrodes as a mask. FIG. 16 illustrates some embodiments of a cross-sectional view 1600 corresponding to act 2422.

At 2424, a first source/drain implantation process is performed to form source/drain regions within the high voltage well. FIG. 17 illustrates some embodiments of a cross-sectional view 1700 corresponding to act 2424.

At 2426, one or more sidewalls spacers are formed on opposing sides of the plurality of gate electrodes. FIG. 18 illustrates some embodiments of a cross-sectional view 1800 corresponding to act 2426.

At 2428, the charge trapping dielectric structure is selectively etched to confine the charge trapping dielectric structure below the control gate electrode and the one or more sidewalls spacers. FIG. 19 illustrates some embodiments of a cross-sectional view 1900 corresponding to act 2428.

At 2430, a second source/drain implantation process is performed to form source/drain regions within the control gate well and the select gate well. FIG. 20 illustrates some embodiments of a cross-sectional view 2000 corresponding to act 2430.

At 2432, the high voltage gate dielectric layer is selectively etched to confine the high voltage gate dielectric layer below the high voltage gate electrode and the one or more sidewalls spacers. FIG. 21 illustrates some embodiments of a cross-sectional view 2100 corresponding to act 2432.

At 2434, a plurality of conductive contacts are formed within an ILD layer over the substrate. FIG. 22 illustrates some embodiments of a cross-sectional view 2200 corresponding to act 2434.

Therefore, the present disclosure relates to a method of forming an embedded flash memory cell that uses a multi-step etching process to selectively etch a charge trapping dielectric structure in a manner that suppresses oxidation induced tunneling oxide encroachment and OED effect by blocking thermal oxide growth in a select gate region, thereby resulting in a tunnel dielectric layer having a relatively uniform thickness.

In some embodiments, the present disclosure relates to a method of forming an integrated chip. The method comprises forming a charge trapping dielectric structure over a logic region, a control gate region, and a select gate region within a substrate. A first charge trapping dielectric etching process is performed to form an opening in the charge trapping dielectric structure over the logic region. A thermal gate dielectric layer is formed within the opening. A second charge trapping dielectric etching process is performed to remove the charge trapping dielectric structure over the select gate region. A plurality of gate electrodes are formed over the thermal gate dielectric layer and the charge trapping dielectric structure.

In other embodiments, the present disclosure relates a method of forming an integrated chip. The method comprises forming a high voltage well, a control well, and a select well within a substrate, and forming a charge trapping dielectric structure over the high voltage well, the control well, and the select well. A first charge trapping dielectric etching process is performed to form an opening in the charge trapping dielectric structure over the high voltage well. A high voltage gate dielectric layer is thermally grown over the high voltage well. A second charge trapping dielectric etching process is performed after thermally growing the high voltage gate dielectric layer to remove the charge trapping dielectric structure over the select well.

In yet other embodiments, the present disclosure relates to an integrated chip. The integrated chip comprises a control gate electrode separated from a substrate by way of a charge trapping dielectric structure, and a select gate electrode separated from the substrate by way of one or more additional gate dielectric layers. The integrated chip further comprises a logic gate electrode separated from the substrate by way of a thermal gate dielectric layer. The substrate has a first upper surface below the thermal gate dielectric layer, which is recessed with respect to a substantially planar upper surface of the substrate below the control gate electrode and the select gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
 a substrate including a control gate memory region and a select gate memory region which are laterally surrounded by an isolation region;
 a control gate electrode separated from the control gate memory region of the substrate by way of a charge trapping dielectric structure, wherein the charge trapping dielectric structure comprises a tunnel dielectric layer;
 a select gate electrode disposed over and separated from the select gate memory region of the substrate by way of one or more additional gate dielectric layers; and
 a logic gate electrode separated from the substrate by way of a thermal gate dielectric layer, wherein the substrate has a first upper surface below the thermal gate dielectric layer, which is recessed with respect to a substantially planar upper surface of the substrate below the control gate electrode and the select gate electrode;
 wherein the tunnel dielectric layer has different thicknesses over the control gate memory region such that the tunnel dielectric layer has a first thickness measured laterally between an outer sidewall of the control gate memory region and a corresponding outer sidewall of the tunnel dielectric layer, and has a second thickness measured vertically between a upper surface of the control gate memory region and a corresponding upper surface of the tunnel dielectric layer, the second thickness being less than the first thickness.

2. The integrated chip of claim 1, further comprising:
 first and second isolation regions arranged within the substrate on opposing sides of the control gate electrode along a first direction, wherein the control gate electrode is separated from the select gate electrode along a second direction that is substantially perpendicular to the first direction.

3. The integrated chip of claim 2,
 wherein the charge trapping dielectric structure further comprises a charge trapping dielectric layer over the tunnel dielectric layer, and a blocking dielectric layer over the charge trapping dielectric layer; and wherein the different thicknesses of the tunnel dielectric layer vary between the first and second isolation regions within a range of between approximately 5% and approximately 25%.

4. The integrated chip of claim 2, wherein the substrate has an upper surface that is curved between the first and second isolation regions.

5. The integrated chip of claim 4, wherein the first and second isolation regions comprise a depressed region that is recessed below the upper surface and a raised region that is elevated above the upper surface and that is laterally separated from the substrate by the depressed region.

6. The integrated chip of claim 1, wherein the thermal gate dielectric layer has a thickness that is larger than a thickness of the charge trapping dielectric structure.

7. The integrated chip of claim 1, further comprising: sidewall spacers on opposing sides of the control gate electrode.

8. An integrated chip, comprising:
a first source/drain region disposed in a substrate;
a second source/drain region disposed in the substrate and spaced apart from the first source/drain region;
a common source/drain region disposed in the substrate and spaced between the first source/drain region and the second source/drain region, wherein a plane that is substantially perpendicular to an upper surface of the substrate traverses the first source/drain region, the second source/drain region, and the common source/drain region;
a select gate electrode extending over a first channel region in the substrate between the first source/drain region and the common source/drain region, the select gate electrode being separated from the first channel region by way of one or more select gate dielectric layers;
a control gate electrode extending over a second channel region in the substrate between the common source/drain region and the second source/drain region, the control gate electrode being separated from the second channel region by way of a charge trapping dielectric structure, the charge trapping dielectric structure comprising a tunnel dielectric layer, a charge trapping dielectric layer over the tunnel dielectric layer, and a blocking dielectric layer over the charge trapping dielectric layer; and
wherein the second channel region has a channel width measured perpendicularly to the plane, and the tunnel dielectric layer has different thicknesses at different respective points along the channel width.

9. The integrated chip of claim 8, wherein the different thicknesses of the tunnel dielectric layer vary at the different respective points along the channel width within a range of between approximately 5% and approximately 25%.

10. The integrated chip of claim 8:
wherein the tunnel dielectric layer has a first thickness over a peripheral region of the first channel region, the peripheral region being a first distance from the plane; and
wherein the tunnel dielectric layer has a second thickness over a central region of the first channel region, the central region being a second distance from the plane, the second distance being less than the first distance; and
wherein the second thickness is less than the first thickness.

11. The integrated chip of claim 10, wherein the second thickness ranges from approximately 75% to approximately 95% of the first thickness.

12. The integrated chip of claim 8, further comprising:
an isolation structure disposed along opposite sides of the second channel region to laterally confine the second channel region to the channel width, wherein the tunnel dielectric layer has a first thickness over a peripheral region of the second channel region nearer the isolation structure and has a second thickness over a central region of the second channel region further from the isolation structure, the second thickness being less than the first thickness.

13. The integrated chip of claim 12, wherein the isolation structure includes a first portion on one side of the second channel region and a second portion on an opposite side of the second channel region, wherein the first portion and the second portion each have a raised central portion arranged at a first height above the upper surface of the substrate and have a depressed portion arranged at a second height below the upper surface of the substrate.

14. The integrated chip of claim 13, wherein the tunnel dielectric layer, the charge trapping dielectric layer, and the blocking dielectric layer extend continuously over the depressed portion and over the raised central portion.

15. The integrated chip of claim 8, wherein a first thickness of the tunnel dielectric layer at a first point on the channel width is approximately 20 nanometers and a second thickness of the tunnel dielectric layer at a second point on the channel width is approximately 15 nanometers.

16. The integrated chip of claim 8, further comprising:
sidewall spacers extending along opposite sidewalls of at least one of the control gate electrode or the select gate electrode, wherein the opposite sidewalls are perpendicularly intersected by the plane.

17. The integrated chip of claim 8, further comprising:
a logic gate electrode separated from the substrate by way of a thermal gate dielectric layer, wherein the substrate has a first upper surface below the thermal gate dielectric layer, which is recessed with respect to a substantially planar upper surface of the substrate below the control gate electrode and the select gate electrode.

18. An integrated chip, comprising:
a select gate electrode extending over an upper surface of a substrate in a first direction, the select gate electrode separated from the upper surface of the substrate by way of one or more select gate dielectric layers;
a control gate electrode extending over the upper surface of the substrate, the control gate electrode spaced apart from the select gate electrode in a second direction that is perpendicular to the first direction, and the control gate electrode separated from the upper surface of the substrate by way of a charge trapping dielectric structure, the charge trapping dielectric structure comprising a tunnel dielectric layer, a charge trapping dielectric layer over the tunnel dielectric layer, and a blocking dielectric layer over the charge trapping dielectric layer;
a logic gate electrode separated from the substrate by way of a thermal gate dielectric layer, wherein the substrate has a first upper surface below the thermal gate dielectric layer, which is recessed with respect to a substantially planar upper surface of the substrate below the control gate electrode and the select gate electrode; and
wherein the control gate electrode extends in the first direction between inner sidewalls of an isolation structure arranged within the substrate; and wherein the tunnel dielectric layer has a first thickness measured normal from an outer sidewall of the substrate directly below the control gate electrode to a corresponding outer sidewall of the tunnel dielectric layer and has a second thickness measured normal from an upper surface of the substrate directly below the control gate electrode and a corresponding upper surface of the tunnel dielectric layer, the second thickness being less than the first thickness.

19. The integrated chip of claim 18, wherein the second thickness ranges from approximately 75% to approximately 95% of the first thickness.

20. The integrated chip of claim 18, wherein the first thickness is approximately 20 nanometers and the second thickness is approximately 15 nanometers.

* * * * *